United States Patent
Troutman

(10) Patent No.: US 8,470,464 B2
(45) Date of Patent: Jun. 25, 2013

(54) METHODS AND APPARATUSES FOR ELECTROCHEMICAL CELL MONITORING AND CONTROL

(75) Inventor: Joseph M. Troutman, Annapolis, MD (US)

(73) Assignee: Alliant Techsystems Inc., Arlington, VA (US)

( * ) Notice: Subject to any disclaimer, the term of this patent is extended or adjusted under 35 U.S.C. 154(b) by 56 days.

(21) Appl. No.: 12/904,830

(22) Filed: Oct. 14, 2010

(65) Prior Publication Data

US 2012/0094150 A1   Apr. 19, 2012

(51) Int. Cl.
  *H01M 10/42*   (2006.01)
  *H01M 10/50*   (2006.01)
  *H01M 2/10*    (2006.01)
  *H01M 6/42*    (2006.01)

(52) U.S. Cl.
  USPC .............. 429/61; 429/50; 429/62; 429/99; 429/150; 429/160

(58) Field of Classification Search
  USPC .... 429/50, 61, 97, 99, 62, 150, 160; 320/122, 320/116, 112; 324/427
  See application file for complete search history.

(56) References Cited

U.S. PATENT DOCUMENTS

| | | | |
|---|---|---|---|
| 5,744,936 A | | 4/1998 | Kawakami |
| 5,773,962 A | | 6/1998 | Nor |
| 5,939,861 A | | 8/1999 | Joko et al. |
| 6,025,696 A | * | 2/2000 | Lenhart et al. ............... 320/122 |
| 6,377,030 B1 | * | 4/2002 | Asao et al. ................... 320/161 |
| 7,508,171 B2 | | 3/2009 | Carrier et al. |
| 7,576,545 B2 | | 8/2009 | Singh et al. |
| 7,667,437 B2 | | 2/2010 | Johnson et al. |
| 7,719,234 B2 | | 5/2010 | Carrier et al. |
| 7,725,137 B2 | | 5/2010 | Lee |
| 7,728,553 B2 | | 6/2010 | Carrier et al. |
| 7,791,318 B2 | | 9/2010 | Johnson et al. |
| 2002/0175655 A1 | * | 11/2002 | Huykman et al. ............ 320/116 |
| 2005/0110460 A1 | * | 5/2005 | Arai et al. .................... 320/116 |
| 2010/0141208 A1 | | 6/2010 | Deal et al. |
| 2010/0194345 A1 | | 8/2010 | Li |
| 2010/0213897 A1 | | 8/2010 | Tse |
| 2010/0219837 A1 | | 9/2010 | Austerschulte |

OTHER PUBLICATIONS

Partial European Search Report for EP 11 18 5056, dated Feb. 1, 2012, 7 pages.

* cited by examiner

*Primary Examiner* — Basia Ridley
*Assistant Examiner* — Kenneth Douyette
(74) *Attorney, Agent, or Firm* — TraskBritt

(57) ABSTRACT

Battery sub-arrays are configured for electrical and mechanical coupling with each other to form a multi-cell battery. A sub-array may be an individual cell or a group of cells. Each sub-array includes a bypass switch to connect the sub-array within the multi-cell battery or bypass the sub-array. Monitor and control circuitry controls the bypass switch in response to voltage measurements, temperature measurements or a combination thereof for the sub-array. Each sub-array is contained in a holder including a housing and a thermal container encompassing a substantial portion of the housing. The housing includes a cell cavity, a sensor cavity, and a circuit cavity. Positive terminals and negative terminals are positioned on sides of the holder such that when holders are mechanically abutted in an array, various electrical connections can be made to connect the cells in series, parallel, or a combination thereof.

12 Claims, 8 Drawing Sheets

Top Section View

Side Section View

METHODS AND APPARATUSES FOR ELECTROCHEMICAL CELL MONITORING AND CONTROL

TECHNICAL FIELD

Embodiments of the present invention relate generally to battery protection circuits and, more particularly, to circuits and methods for monitoring and controlling electrochemical cells.

BACKGROUND

Demand for batteries has been increasing dramatically. With this increase, there is a need for high-energy batteries that use multiple electrochemical cells coupled together to provide higher current and high voltage outputs.

A multi-cell battery pack usually includes individual electrochemical cells connected in series to create a battery with a higher voltage. For example, four Lithium Ion (Li-Ion) electrochemical cells with a nominal voltage of about 3.6 volts may be connected in series to develop a multi-cell battery with a nominal voltage of about 14.4 volts. Two of these three-cell series-connected groupings may be connected in parallel to create a multi-cell battery including a total of six cells with twice the current capability at about 14.4 volts.

Electrochemical cells, particularly Li-Ion cells, can be damaged by excessive charge voltage or when discharged to too low of a voltage. Electrochemical cells can also be damaged by extremes in temperature on both the hot extreme and the cold extreme. Moreover, undesirable and unsafe reactions, such as cell venting, electrolyte leakage, smoke, fire, and cell rupture may occur without proper controls on environmental conditions, charging conditions, and discharging conditions.

Monitoring and controlling systems have been proposed to deal with some of these issues. However, these proposals generally monitor the condition of the overall multi-cell battery and disconnect the multi-cell battery if an adverse condition is detected.

FIG. 1 is a simplified circuit diagram of a conventional monitor and control circuit for a battery pack including multiple electrochemical cells. Electrochemical cells EC1, EC2, EC3, and EC4 are coupled in series to create a multi-cell battery 160 that can develop a voltage between a positive terminal (+Vbat) 140 and a negative terminal (−Vbat) 150. A battery monitor 100 is coupled to the positive terminal 140 and negative terminal 150 to determine whether the multi-cell battery 160 is within a desired voltage range during, for example, charging and discharging. A temperature sensor 120 is included to determine if the multi-cell battery 160 is in an acceptable temperature range. A controller 130 uses outputs from the temperature sensor 120 and voltage monitor 110 to determine whether to disconnect or connect the multi-cell battery 160 from the negative terminal 150 using switch S1. However, this conventional monitor and control circuit only operates on the multi-cell battery as a whole and doesn't give information or control at the individual electrochemical cell level.

There is a need to improve the overall safety and reliability of electrochemical cells arrayed together by monitoring and controlling the electrochemical cells at a cell level or a sub-array level.

BRIEF SUMMARY

Embodiments of the present invention comprise apparatuses and methods to improve the overall safety and reliability of electrochemical cells arrayed together by monitoring and controlling the electrochemical cells at a cell level, a sub-array level, or a combination thereof.

An embodiment of the invention includes a battery sub-array comprising a sub-array electrochemical cell configured for coupling with other sub-array electrochemical cells to form a multi-cell battery. A temperature sensor is configured for disposition in a holder for the sub-array electrochemical cell and proximate the sub-array electrochemical cell. A bypass switch is operably coupled to switch a first holder terminal to either a second holder terminal or a cell terminal of the sub-array electrochemical cell. Monitor and control circuitry is operably coupled to the sub-array electrochemical cell, the bypass switch, and the temperature sensor. The monitor and control circuitry is configured for monitoring a temperature of the sub-array electrochemical cell and, responsive to the monitoring, selectively opening the bypass switch to couple the electrochemical cell between the first holder terminal and the second holder terminal or selectively closing the bypass switch to bypass the electrochemical cell.

Another embodiment of the invention includes a multi-cell battery comprising two or more electrochemical cell circuits operably coupled to form the multi-cell battery. Each of the two or more electrochemical cell circuits includes a single electrochemical cell, a bypass switch operably coupled to switch a first holder terminal to either a second holder terminal or a cell terminal of the single electrochemical cell, and monitor and control circuitry operably coupled to the single electrochemical cell and the bypass switch. The monitor and control circuitry is configured for monitoring a voltage across the single electrochemical cell and selectively operating the bypass switch to connect or disconnect the cell terminal from the second holder terminal responsive to the monitoring.

Another embodiment of the invention comprises a monitor and control method including monitoring at least one of a temperature of an electrochemical cell and a voltage across the electrochemical cell and coupling a first terminal of the electrochemical cell to a first terminal of a holder for the electrochemical cell. Responsive to the monitoring, the method also includes selectively coupling a second terminal of the holder either to a second terminal of the electrochemical cell or to the first terminal of the holder.

Yet another embodiment of the invention comprises a monitoring and control method including monitoring at least one of a temperature of an electrochemical cell and a voltage across the electrochemical cell and electrically coupling terminals of the electrochemical cell to corresponding terminals of a holder for the electrochemical cell. Responsive to the monitoring, the method also includes selectively bypassing the electrochemical cell by coupling the terminals of the holder together and decoupling at least one terminal of the electrochemical cell from a corresponding terminal of the holder.

Yet another embodiment of the invention comprises a holder for an electrochemical cell including a housing and a thermal container encompassing a substantial portion of the housing. The housing includes a first serial side, a second serial side opposite from the first serial side, a first parallel side, and a second parallel side opposite from the first parallel side. A cell cavity within the housing is configured to receive the electrochemical cell, a sensor cavity within the housing is configured to receive a temperature sensor, and a circuit cavity within the housing configured to receive circuitry for monitoring and controlling the electrochemical cell. A positive terminal on the first serial side is configured for operable coupling to the electrochemical cell and a negative terminal on the second serial side is configured for operable coupling to the electrochemical cell. The housing is configured for mechanical and electrical engagement with a first other electrochemical cell holder on the first serial side and mechanical and electrical engagement with a second other electrochemical cell holder on the first serial side.

DETAILED DESCRIPTION

Figure 1:
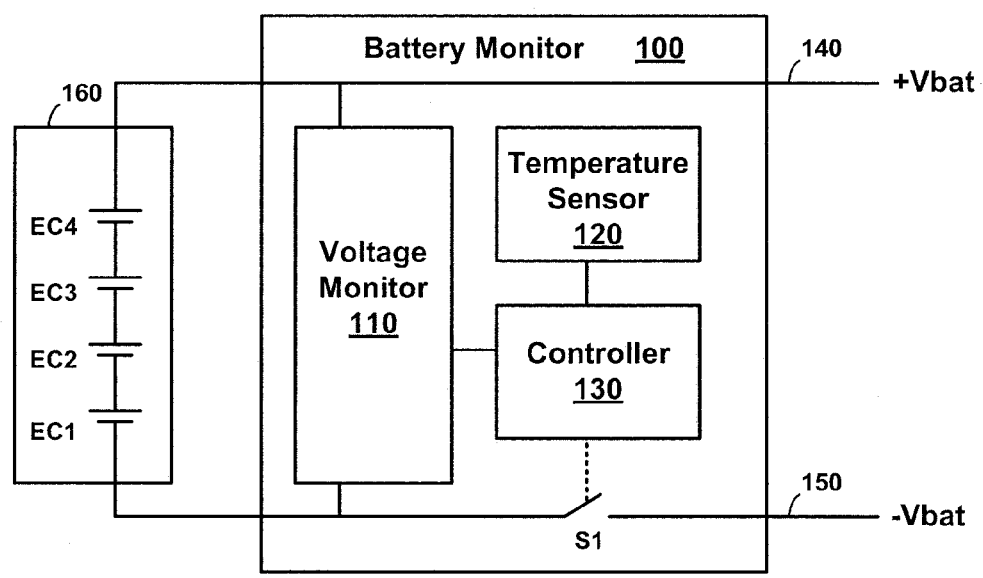
FIG. 1 is a simplified circuit diagram of a conventional monitor and control circuit for a multi-cell battery pack including multiple electrochemical cells.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention. It should be understood, however, that the detailed description and the specific examples, while indicating examples of embodiments of the invention, are given by way of illustration only and not by way of limitation. From this disclosure, various substitutions, modifications, additions rearrangements, or combinations thereof within the scope of the present invention may be made and will become apparent to those of ordinary skill in the art.

In accordance with common practice the various features illustrated in the drawings may not be drawn to scale. The illustrations presented herein are not meant to be actual views of any particular method, device, or system, but are merely idealized representations that are employed to describe various embodiments of the present invention. Accordingly, the dimensions of the various features may be arbitrarily expanded or reduced for clarity. In addition, some of the drawings may be simplified for clarity. Thus, the drawings may not depict all of the components of a given apparatus (e.g., device) or method. In addition, like reference numerals may be used to denote like features throughout the specification and figures.

Those of ordinary skill in the art would understand that information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

Those of ordinary skill would further appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the invention described herein.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

When describing circuit elements, such as, for example, resistors, capacitors, transistors, and electrochemical cells, designators for the circuit elements begin with an element type designator (e.g., R, C, M, EC, respectively) followed by a numeric indicator. Power sources such as, for example VDD and VCC as well as ground voltages may be generically indicated. When appropriate, these power signals may be described in detail. In other cases, the power signals may not be described as it would be apparent to a person of ordinary skill in the art which power signal should be used.

Embodiments of the present invention comprise apparatuses and methods for monitoring and controlling electrochemical cells configured to be arrayed in serial, parallel, or a combination thereof to form a multi-cell battery with a desired voltage and current capability.

As used herein, a single electrochemical cell refers to one electrochemical cell, which may include accompanying monitor and control circuitry. When reference is made herein to "an electrochemical cell" or "the electrochemical cell," it should be interpreted as a single electrochemical cell unless otherwise stated.

A "sub-array electrochemical cell" or a "battery sub-array" refers to one or more electrochemical cells connected in serial, parallel, or a combination thereof with accompanying monitor and control circuitry wherein the sub-array of electrochemical cells is configured and intended for electrical and mechanical coupling to similarly configured sub-arrays of electrochemical cells to form a multi-cell battery.

A multi-cell battery refers to a battery including a plurality of single electrochemical cells operably coupled together or a battery including a plurality of sub-array electrochemical cells operably coupled together.

Figure 2A:
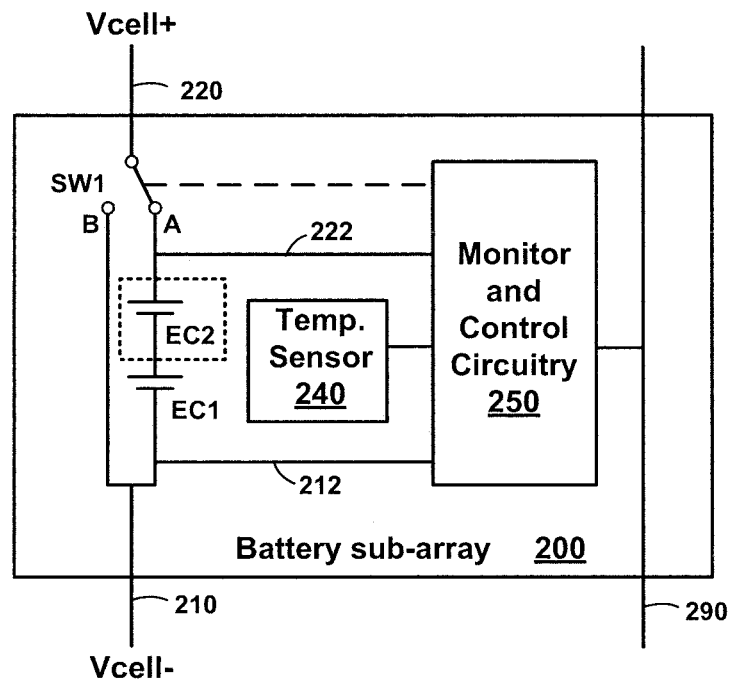
FIGS. 2A and 2B are simplified circuit diagrams of a battery sub-array including monitor and control circuitry for one or more electrochemical cells according to embodiments of the present invention.
Figure 2B:
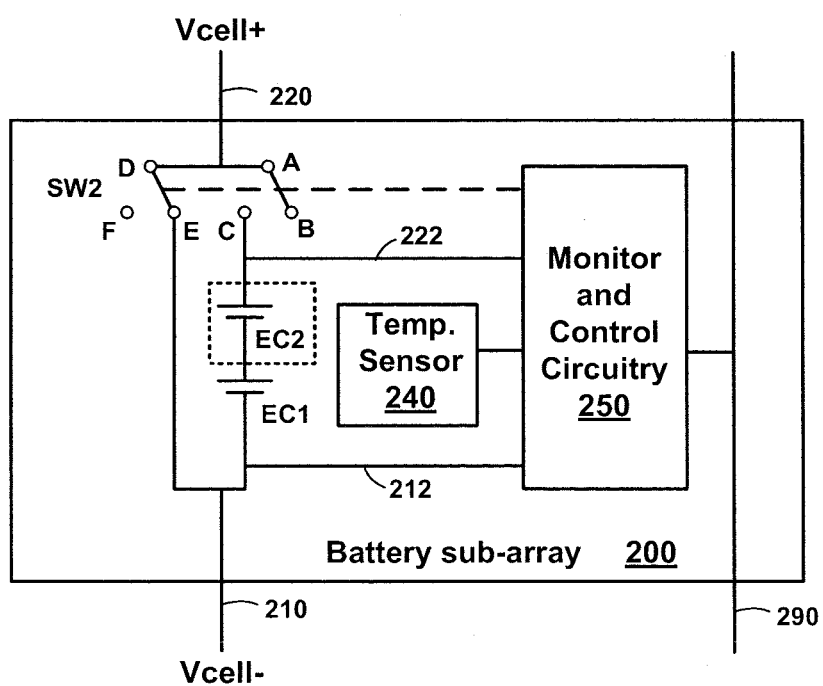

FIGS. 2A and 2B are simplified circuit diagrams of a battery sub-array 200 including monitor and control circuitry 250 for one or more electrochemical cells according to embodiments of the present invention. An electrochemical cell EC1 is coupled between a positive terminal (Vcell+) 220 and a negative terminal (Vcell−) 210. A bypass switch SW1 is coupled to the positive terminal 220 and configured for switching between an A position and a B position. The A position is referred to as an open position for the bypass switch SW1 and the B position is referred to as a closed position for the bypass switch SW1. When in the closed position, the bypass switch SW1 connects the positive terminal 220 to the negative terminal 210, effectively bypassing the electrochemical cell EC1. When in the open position, the bypass switch SW1 connects a positive terminal of the electrochemical cell EC1 to the positive terminal 220 of the battery sub-array 200, effectively connecting the electrochemical cell EC1 between the positive terminal 220 and the negative terminal 210.

In some embodiments of the battery sub-array 200, multiple electrochemical cells may be used. As a non-limiting example, an optional second electrochemical cell EC2 is shown in series with the electrochemical cell EC1. While not shown, the two electrochemical cells may also be connected in parallel. As another non-limiting example, the battery sub-array 200 may include four electrochemical cells connected in a 2×2 array with two sets of electrochemical cells connected in parallel and each set includes two electrochemical cells in series.

The monitor and control circuitry 250 may be coupled to a positive terminal 222 of the electrochemical cell EC1 and a negative terminal 212 of the electrochemical cell EC1. A temperature sensor 240 may be included and disposed in proximity to the electrochemical cell EC1 to sense its temperature. The temperature sensor 240, if included, is operably coupled to the monitor and control circuitry 250.

The monitor and control circuitry 250 uses voltage information from the positive terminal 222 and the negative terminal 212, temperature information, or a combination thereof, to determine whether the electrochemical cell EC1 is operating within acceptable parameters and based on that determination operates the bypass switch SW1.

Some embodiments may include a communication bus 290 coupled to the monitor and control circuitry 250. The communication bus 290 may be used to convey information about the battery sub-array 200 to an external controller. As non-limiting examples, such information may include serial numbers of the electrochemical cell EC1 and battery sub-array 200, voltage information, temperature information, maintenance information, and historical information about voltage, temperature, and operation of the bypass switch SW1. The communication bus 290 may also convey information to the battery sub-array 200, such as, for example, voltage and temperature parameters for acceptable operation, as is explained more fully below. The communication bus may be any suitable bus, such as, for example, a military standard 1553 serial communication bus, an RS-422 serial communication bus, or a Universal Serial Bus (USB).

FIG. 2A illustrates the bypass switch SW1 coupled on the positive terminal 220 side of the battery sub-array 200. However, in other embodiments of the invention, the bypass switch may be coupled on the negative terminal 210 of the battery sub-array 200 and the negative terminal of the electrochemical cell EC1.

FIG. 2B illustrates a circuit similar to that of FIG. 2A except using a bypass switch SW2 instead of the bypass switch SW1 of FIG. 2A. The double-pole double throw bypass switch SW2 is configured such that in a first position terminal A connects to terminal B and terminal D connects to terminal E. In a second position terminal A connects to terminal C and terminal D connects to terminal F. Thus, in the first position the bypass switch SW2 is closed to connect the positive terminal 220 to the negative terminal 210, effectively bypassing the electrochemical cell EC1. When in the second position the bypass switch SW2 is to connect the positive terminal of the electrochemical cell EC1 to the positive terminal 220 of the battery sub-array 200, effectively connecting the electrochemical cell EC1 between the positive terminal 220 and the negative terminal 210.

The electrochemical cell EC1 may be a Li-Ion cell. In addition other types of electrochemical cells may be used, such as, for example, lithium metal, lithium polymer, nickel cadmium (NiCd), nickel metal hydride (NiMH), and lead acid cells.

As the name suggests, the battery sub-array 200 is configured to be coupled with other battery sub-arrays 200 to form a multi-cell battery.

Figure 3:
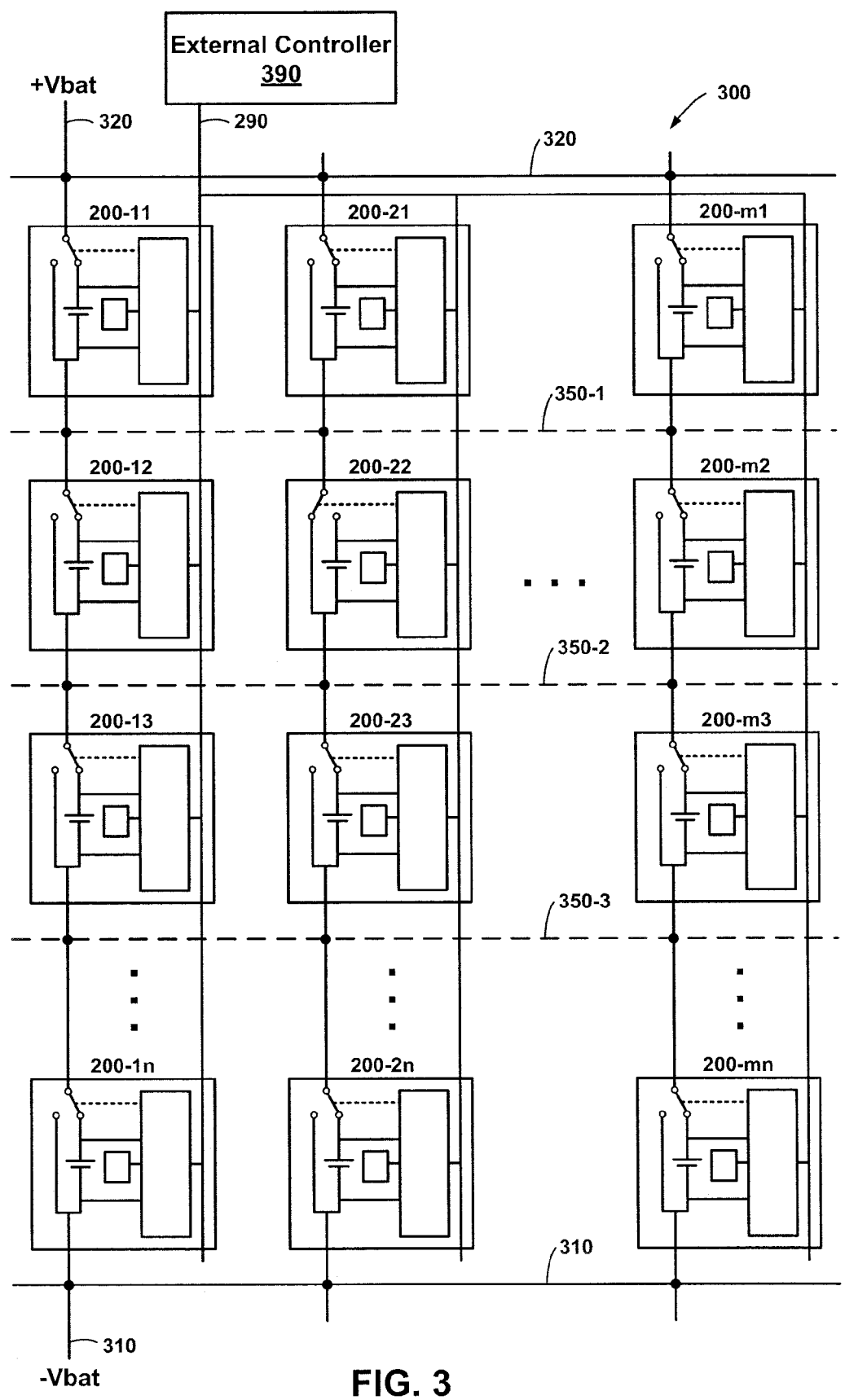
FIG. 3 is a simplified circuit diagram of an array of the battery sub-arrays illustrated in FIG. 2.

FIG. 3 is a simplified circuit diagram of a multi-cell battery 300 as an array of the battery sub-arrays 200 illustrated in FIG. 2. The battery sub-arrays 200 are numbered with index values for the position within the array. For example, the battery sub-array 200-23 is in the second column and the third row. The entire multi-cell battery 300 includes "m" columns and "n" rows. In FIG. 2, columns are coupled in series to develop a larger voltage between a negative battery terminal 310 and a positive battery terminal 320. For example, if each individual battery sub-array 200 includes a Li-Ion electrochemical cell EC1 with a nominal voltage of about 3.6 volts and the array includes 5 rows, each column would deliver about 18 volts. The columns are coupled together in parallel with each of the first row's positive terminals connected to the positive battery terminal 320 and each of the $n^{th}$ row's negative terminals coupled to the negative battery terminal 310.

In some embodiments, the intermediate connections between rows may be connected, as indicated by the dashed lines for parallel connections 350-1, 350-2, and 350-3. As a non-limiting example, such intermediate parallel connections may be useful for balancing voltages across the parallel connections of battery sub-arrays 200 for any particular row.

An external controller 390 may be coupled to the communication bus 290 and the communication bus 290 connections for each of the battery sub-arrays 200 may be coupled together. As non-limiting examples, the external controller 390 may be a controller for the multi-cell battery 300 or may be a controller for the device being powered by the multi-cell battery 300.

All of the battery sub-arrays 200 are illustrated with the bypass switches SW1 open except for battery sub-array 200-22. As a result, battery sub-array 200-22 is being bypassed while all of the other battery sub-arrays 200 are connected in the array in their appropriate serial or parallel connections.

Figure 4A:
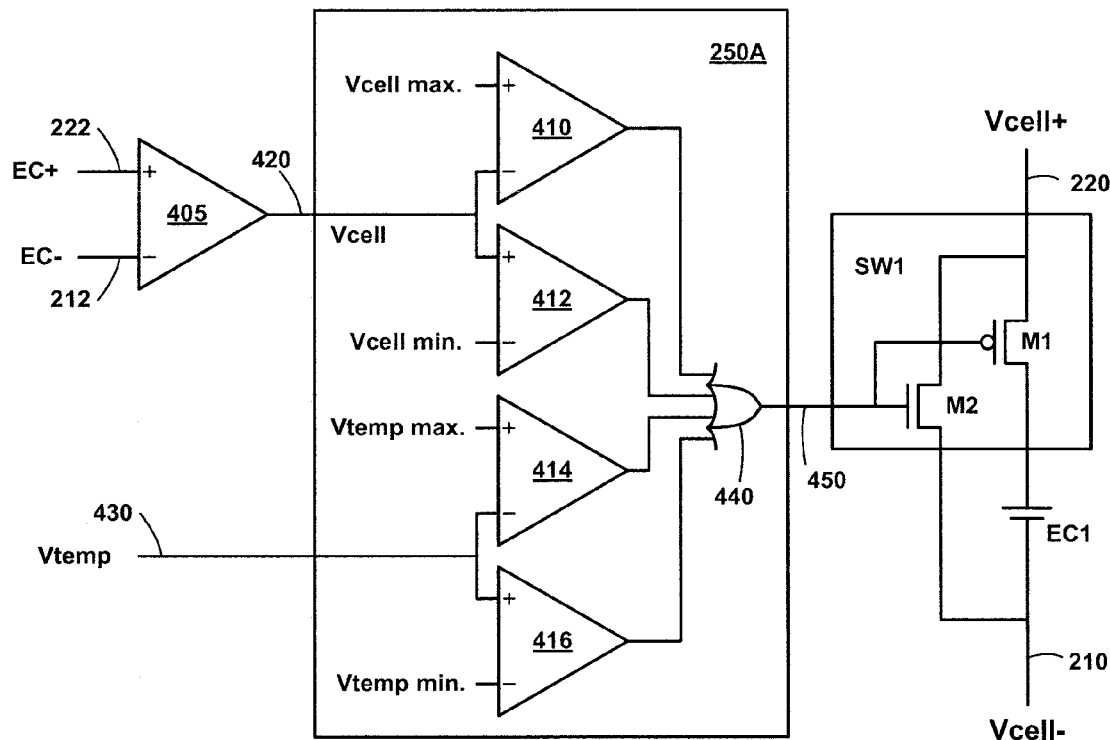
FIGS. 4A and 4B are simplified circuit diagrams of embodiments of the monitor and control circuitry of FIG. 2.
Figure 4B:
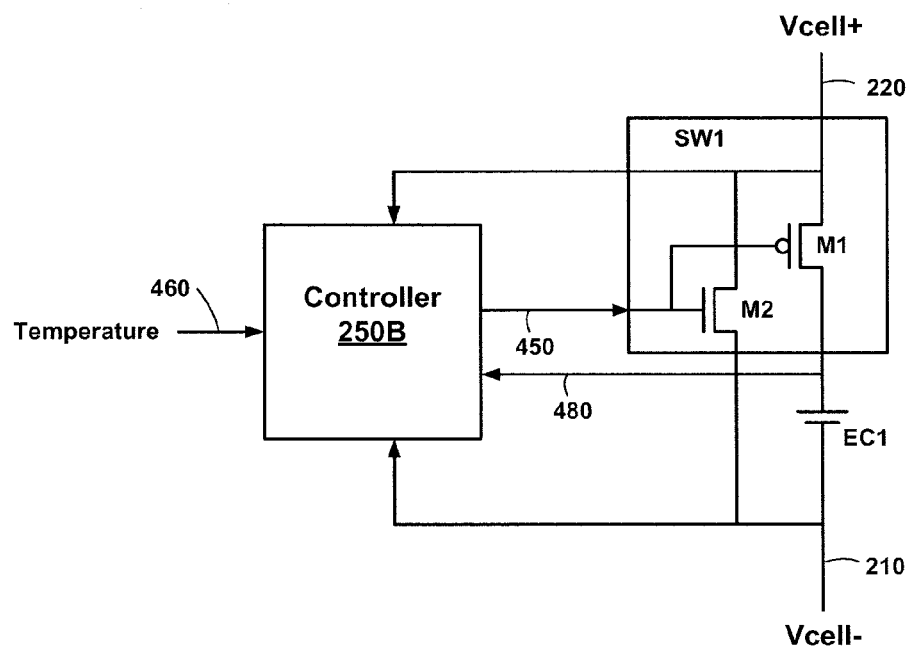

FIGS. 4A and 4B are simplified circuit diagrams of embodiments of the monitor and control circuitry of FIG. 2. In the monitor and control circuitry 250A of FIG. 4A, a temperature signal (Vtemp) 430 comes from the temperature sensor 240 (FIG. 2) and a voltage differential signal 420 indicates a voltage across the electrochemical cell EC1.

A differential amplifier 405 generates the voltage differential signal 420 as a difference between a voltage on the positive terminal 222 of the electrochemical cell EC1 and a voltage on the negative terminal 212 of the electrochemical cell EC1.

A maximum voltage comparator 410 compares the voltage differential signal 420 to a reference voltage (Vcell max) indicating a maximum voltage that should be allowed across electrochemical cell EC1. If the voltage differential signal 420 exceeds the reference voltage (Vcell max), the maximum voltage comparator 410 will generate a high on its output, otherwise the output will remain low.

A minimum voltage comparator 412 compares the voltage differential signal 420 to a reference voltage (Vcell min) indicating a minimum voltage that should be allowed across electrochemical cell EC1. If the voltage differential signal 420 is less than the reference voltage (Vcell min), the minimum voltage comparator 412 will generate a high on its output, otherwise the output will remain low.

A maximum temperature comparator 414 compares a temperature signal 430 to a reference voltage (Vtemp max) indicating a maximum temperature that should be allowed for electrochemical cell EC1. If the temperature signal 430 exceeds the reference voltage (Vtemp max), the maximum temperature comparator 414 will generate a high on its output, otherwise the output will remain low.

A minimum temperature comparator 416 compares the temperature signal 430 to a reference voltage (Vtemp min) indicating a minimum temperature that should be allowed across electrochemical cell EC1. If the temperature signal 430 is less than the reference voltage (Vtemp min), the minimum temperature comparator 416 will generate a high on its output, otherwise the output will remain low.

An OR-gate 440 (or possibly a wired-OR connection) generates a high on a switch control signal 450 if an output of any of the comparators (410, 412, 414, and 416) is high. The bypass switch SW1 is illustrated as a p-channel Metal-Oxide Field-Effect Transistor (MOSFET) M1 and an n-channel MOSFET M2. If the switch control signal 450 is high, the n-channel MOSFET M2 will be on and the p-channel MOSFET M1 will be off, effectively bypassing the electrochemical cell EC1. If the switch control signal 450 is low, the p-channel MOSFET M1 will be on and the n-channel MOSFET M2 will be off, effectively coupling the electrochemical cell EC1 between the positive terminal 220 and the negative terminal 210.

Many other circuit configurations may be used for the bypass switch SW1. As non-limiting examples, relays, bipolar transistor, and bipolar junction field-effect transistors may also be used. In addition other configurations may be used such as both M1 and M2 being n-channel MOSFETs, both M1 and M2 being p-channel MOSFETs, and both M1 and M2 being pass-gates configured as a p-channel and n-channel MOSFETs in parallel.

FIG. 4B illustrates another embodiment of monitor and control circuitry 250B as a controller 250B. This controller may be a circuit such as, for example, a Field Programmable Gate Array (FPGA), and Application Specific Integrated Circuit (ASIC), a microcontroller, or a microprocessor. The controller 250B may be coupled to a temperature signal 460 from the temperature sensor 240 (FIG. 2), the negative terminal 210, the positive terminal 220, and a positive cell terminal 480 from the electrochemical cell EC1. The controller 250B samples the analog voltages from these signals and uses one or more analog-to-digital converters to create digital values for each of the signals. The controller can, therefore, generate a digital value for the temperature, the voltage on the positive terminal 220, the voltage on the negative terminal 210, and the voltage on the positive cell terminal 480. The controller 250B operates the switch control signal 450 to control the bypass switch SW1 in a manner similar to that discussed above with respect to FIG. 4A.

Figure 5:
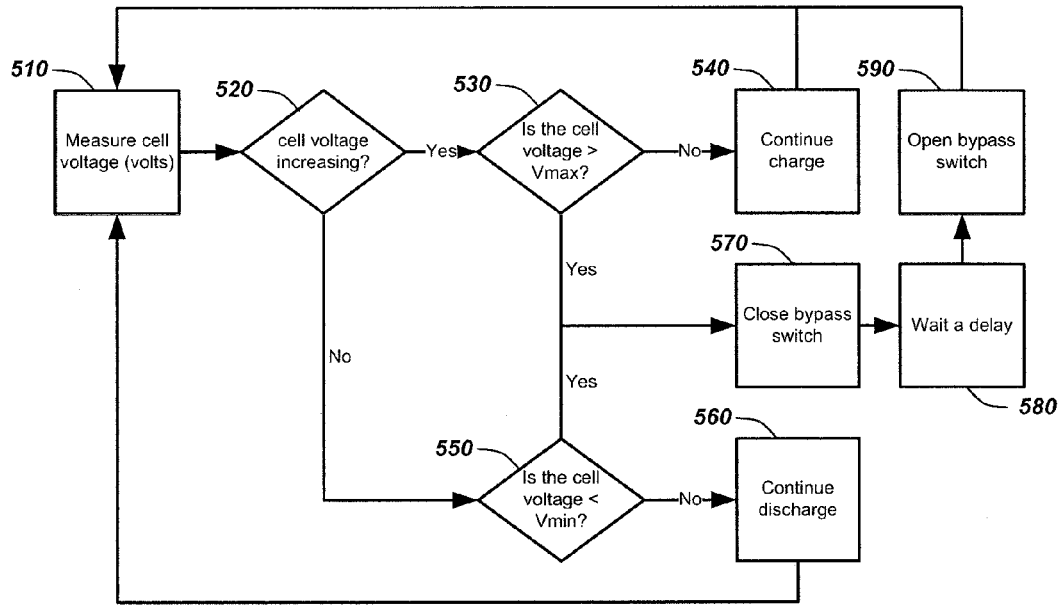
FIG. 5 is a simplified flow diagram illustrating monitoring of voltage levels of an electrochemical cell or sub-array.

FIG. 5 is a simplified flow diagram illustrating monitoring of voltage levels of an electrochemical cell or sub-array. Operation block 510 indicates that the voltages across the electrochemical cell EC1 are measured. Decision block 520 indicates a test to determine if the cell voltage is increasing, which generally indicates that the electrochemical cell EC1 is being charged. If so, decision block 530 indicates a test to see if the cell voltage is greater than a predetermined maximum voltage. If not, operation block 540 indicates that the charging may continue and the bypass switch SW1 remains open. The process then loops back to gather new voltage samples and repeat the process.

If the cell voltage is greater than the predetermined maximum voltage, operation block 570 indicates that the bypass switch SW1 is closed to bypass the electrochemical cell EC1. In some embodiments, the process may stop there and the bypass switch SW1 may remain closed permanently or until reset by a command from the external controller 390 (FIG. 3).

In other embodiments, operation block 580 indicates that the process may wait for a delay time, then operation block 590 opens the bypass switch SW1 to connect the electrochemical cell EC1 to the terminals and the process repeats.

Returning to decision block 520, if the cell voltage is decreasing or constant, the cell is not providing energy or is discharging. Decision block 550 tests to see if the cell voltage is below a predetermined minimum voltage. If not, operation block 560 indicates that the discharge process continues and the process loops back to gather new voltage samples and repeat the process. If the cell voltage is less than the predetermined minimum voltage, the process continues at operation block 570 as discussed above.

Figure 6:
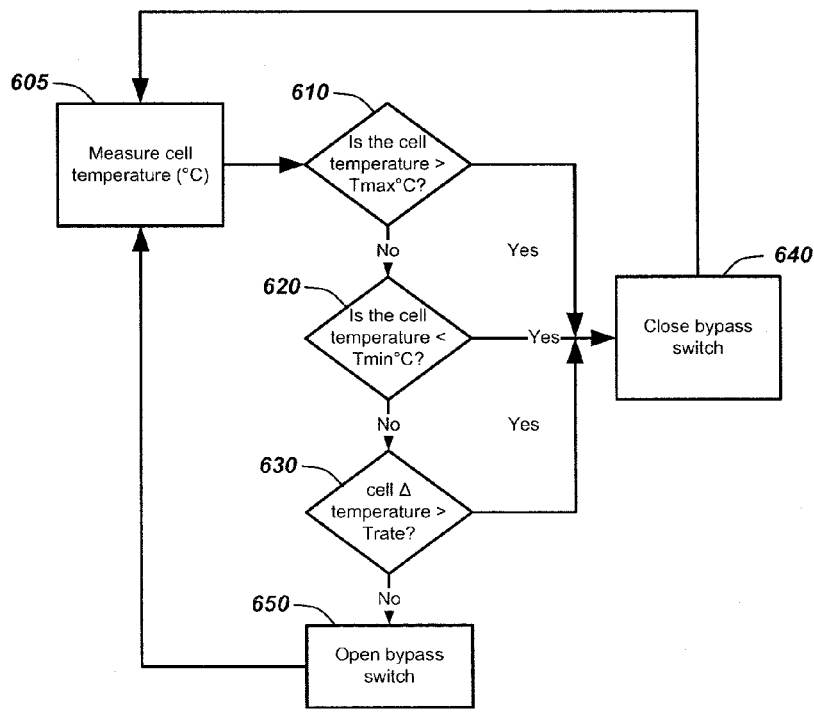
FIG. 6 is a simplified flow diagram illustrating monitoring of temperature of an electrochemical cell or sub-array.

FIG. 6 is a simplified flow diagram illustrating monitoring of temperature of an electrochemical cell or sub-array. Operation block 605 indicates that the temperature near the electrochemical cell EC1 is sampled. Decision block 610 indicates a test to determine if the cell temperature is greater than a predetermined maximum temperature. If so, operation block 640 indicates that the bypass switch SW1 is closed to bypass the electrochemical cell EC1.

If the cell temperature is not greater than the predetermined maximum temperature, decision block 620 indicates a test to determine if the cell temperature is less than a predetermined minimum temperature. If so, operation block 640 indicates that the bypass switch SW1 is closed to bypass the electrochemical cell EC1. If not, decision block 630 indicates a test to determine if a rate of change for the temperature is greater than a predetermined rate threshold. If so, operation block 640 indicates that the bypass switch SW1 is closed to bypass the electrochemical cell EC1. If not, the bypass switch is open at operation block 650 (if not already open) to connect the electrochemical cell EC1 to the terminals and the process repeats.

A suitable rate of change may depend on environmental conditions and type of electrochemical cell EC1. As a non-limiting example, for one type of Li-Ion cell the predetermined rate threshold may be about 2.5 degrees C./second.

After operation block 640, the process also repeats to take a new temperature measurement and perform the tests again.

The processes of FIGS. 5 and 6, may run in parallel or in serial and may run in a continuous loop or may be set to trigger at specific intervals, such as, for example, at one-second intervals.

These various tests for cell voltage being greater than or less predetermined maximums and minimums may be referred to herein as voltage events. Similarly, the various tests for cell temperature being greater than or less predetermined maximums and minimums may be referred to herein as temperature events.

As non-limiting examples, for a certain type of Li-Ion electrochemical cell, a predetermined maximum temperature may be about 50 degrees C. and a predetermined minimum temperature may be about −10 degrees C. As non-limiting examples, for a certain type of Li-Ion electrochemical cell, a predetermined maximum voltage may be about 4.2 volts and a predetermined minimum voltage may be about 2.8 volts.

Figure 7:
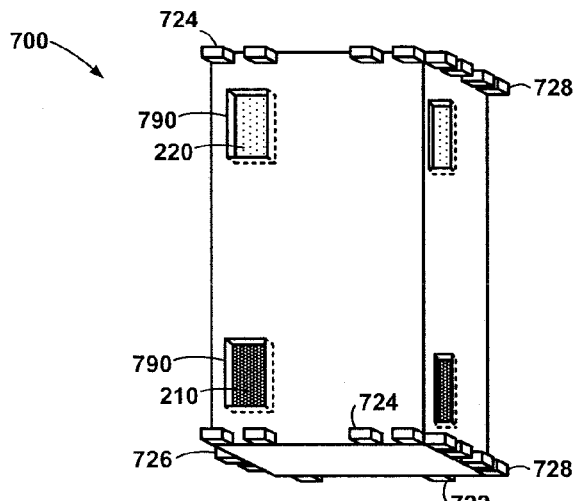
FIG. 7 is a simplified isometric view of a holder for an electrochemical cell and monitor and control circuitry according to an embodiment of the present invention.
Figure 8:
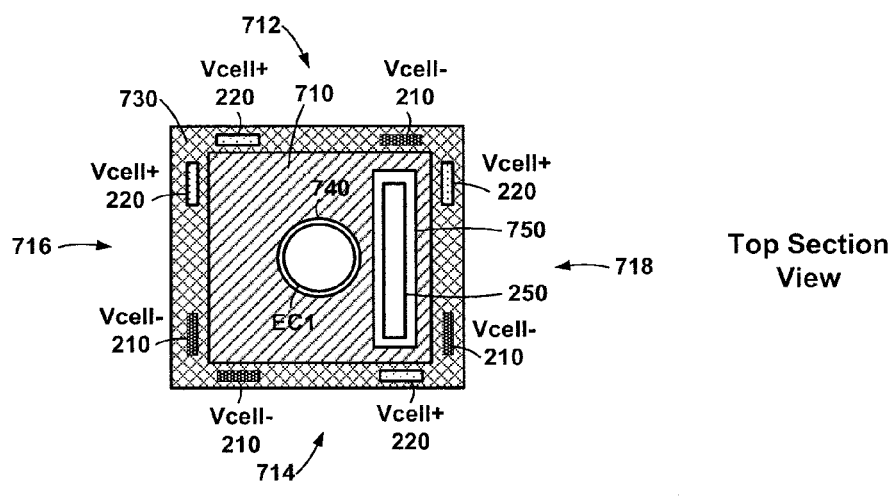
FIG. 8 is a top cross-section view of the holder of FIG. 7.
Figure 9:
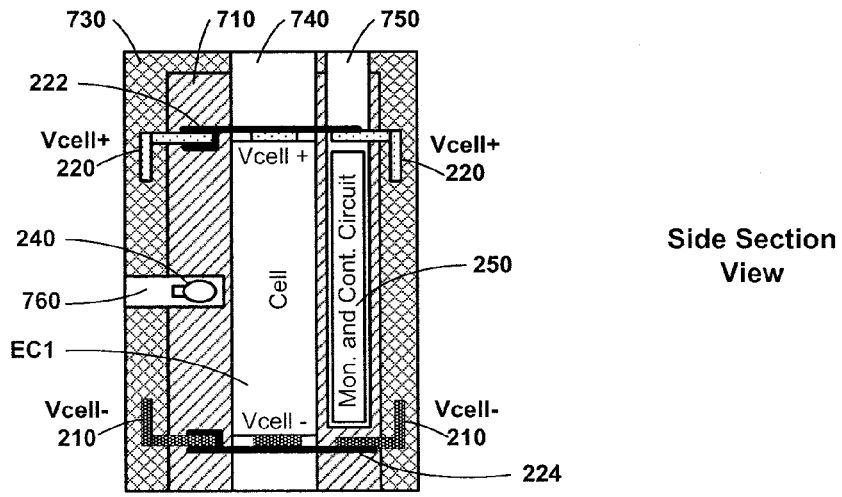
FIG. 9 is a side cross-section view of the holder of FIG. 7.

FIG. 7 is a simplified isometric view of a holder 700 for the electrochemical cell EC1 (FIGS. 8 and 9) and monitor and control circuitry 250 (FIGS. 8 and 9) according to an embodiment of the present invention. FIG. 8 is a top cross-section view of the holder 700 of FIG. 7. FIG. 9 is a side cross-section view of the holder 700 of FIG. 7. FIGS. 7, 8, and 9 are discussed together.

The holder 700 includes a housing 710 with a first serial side 712, a second serial side 714 opposite from the first serial side 712, a first parallel side 716, and a second parallel side 718 opposite from the first parallel side 716. The serial sides (712 and 714) refer to sides of the holder 700 that have terminal connections for placing the battery sub-arrays 200 (FIG. 2) in series connection when the holders 700 are abutted with serial sides 712, 714 together. Similarly, the parallel sides (716 and 718) refer to sides of the holder 700 that have terminal connections for placing the battery sub-arrays 200 (FIG. 2) in parallel connection when the holders 700 are abutted with parallel sides 716, 718 together.

First protrusions 722 on the first serial side 712 extend from the holder 700 at or near the top and bottom of the holder 700. Second protrusions 724 on the second serial side 714 extend from the holder 700 at or near the top and bottom of the holder 700. Third protrusions 726 on the first parallel side 716 extend from the holder 700 at or near the top and bottom of the holder 700. Finally, fourth protrusions 728 extend from the second parallel side 718 of the holder 700 at or near the top and bottom of the holder 700. The protrusions 722, 724, 726, 728 may be configured such that they will mesh with protrusions 722, 724, 726, 728 from an opposing side of another holder 700 abutted against the holder 700. In other words, first protrusions 722 on the first serial side 712 of one holder 700 may mesh with second protrusions 724 on the second serial side 714 of another holder 700. Similarly, third protrusions 726 on the first parallel side 716 of one holder 700 may mesh with fourth protrusions 728 on the second parallel side 718 of another holder 700. Moreover, the protrusions may be configured such that holders can only be abutted in proper directions such as parallel side to parallel side and serial side to serial side.

A cell cavity 740 within the housing 710 is configured to receive the electrochemical cell EC1. A sensor cavity 760 within the housing 710 is configured to receive the temperature sensor 240, and a circuit cavity 750 within the housing 710 is configured to receive the monitor and control circuitry 250.

Positive terminals 220 may be located at various locations on the various sides of the holder 700 as illustrated in FIGS. 7, 8, and 9. Similarly, negative terminals 210 may be located at various locations on the various sides of the holder 700 as illustrated in FIGS. 7, 8, and 9. The terminals (210 and 220) may be positioned slightly recessed in terminal cavities 790 such that when the holders 700 are abutted, electrical connections are not necessarily formed where the terminals line up. Various possible electrical connections between abutting holders 700 are discussed below with reference to FIGS. 11 and 12. The positive terminals 220 may be electrically coupled to the positive cell terminal by coupling strap 222 and the negative terminals 210 may be electrically coupled to the negative terminal 210 by coupling strap 224.

A thermal container 730 may encompass a substantial portion of the housing 710. As examples, the substantial covering may include all sides of the housing 710 except for openings for exposing the terminals (210 and 220). Alternatively, the thermal container 730 may not cover the top and bottom sides of the holder 700. As another alternative, the thermal container 730 may include openings for access to the various cavities (740, 750 and 760). The thermal container 730 may be configured to thermally spread heat more evenly around the container as well as shield heat of one holder 700 from an abutting holder 700. As a non-limiting example, the thermal container 730 may be formed from a flexible graphite material such as EGRAF® SPREADSHIELD™ from GrafTech International Ltd. of Parma, Ohio.

As a non-limiting example, the housing 710 may be aluminum that is machined to include the various cavities (74, 750, 760, and 790) and various protrusions (722, 724, 726, and 728). As another non-limiting example, the housing 710 may be formed of a suitable plastic material. Moreover, in some embodiments, the protrusions (722, 724, 726, and 728) may be configured as part of the housing 710 and in other embodiments with a suitable thermal container 730, the protrusions (722, 724, 726, and 728) may be configured as part of the thermal container 730. As a non-limiting example of size, the holder 700 may have a height of about 3 inches and side-to-side dimensions of about 1.25 inches by 1.25 inches.

Figure 10:
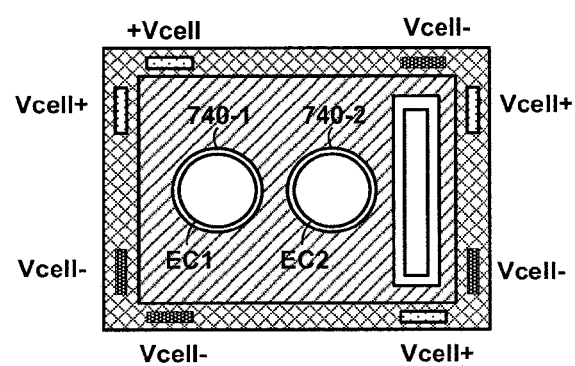
FIG. 10 is a top cross-section view of a holder similar to that of FIG. 7 except the holder of FIG. 10 is configured for a sub-array of two electrochemical cells.

FIG. 10 is a top cross-section view of a holder 700 similar to that of FIG. 7 except the holder 700 of FIG. 10 is configured for a sub-array of two electrochemical cells EC1 and EC2 placed in respective cell cavities 740-1 and 740-2.

Figure 11:
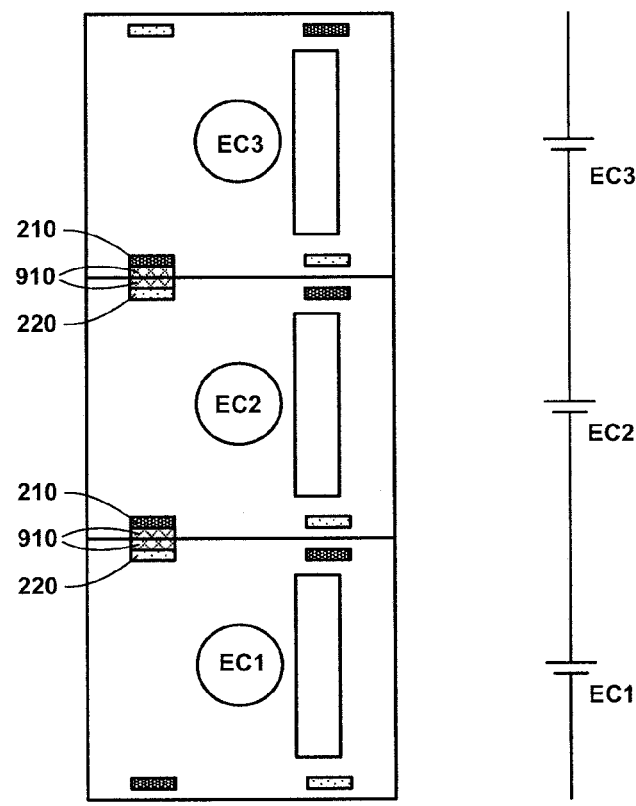
FIG. 11 is a top view of three holders mechanically and electrically coupled to form a multi-cell battery of three electrochemical cells in series.

FIG. 11 is a top view of three holders 700 mechanically and electrically coupled to form a multi-cell battery of three electrochemical cells (EC1, EC2, and EC3) in series. In this embodiment, connection plugs 910 are placed in appropriate terminal cavities 790 (FIG. 7) such that a positive terminal 220 for the holder of electrochemical cell EC1 connects to a negative terminal 210 for the electrochemical cell EC2 and a positive terminal 220 for the holder of electrochemical cell EC2 connects to a negative terminal 210 for the electrochemical cell EC3. The connection plugs 910 fit in the terminal cavities 790 such that the connection plugs 910 are coplanar with, or slightly protrude from, the side of the holder 700. As a result, when the holders 700 are properly mechanically abutted, proper electrical connections are made while the other terminals remain unconnected.

Figure 12:
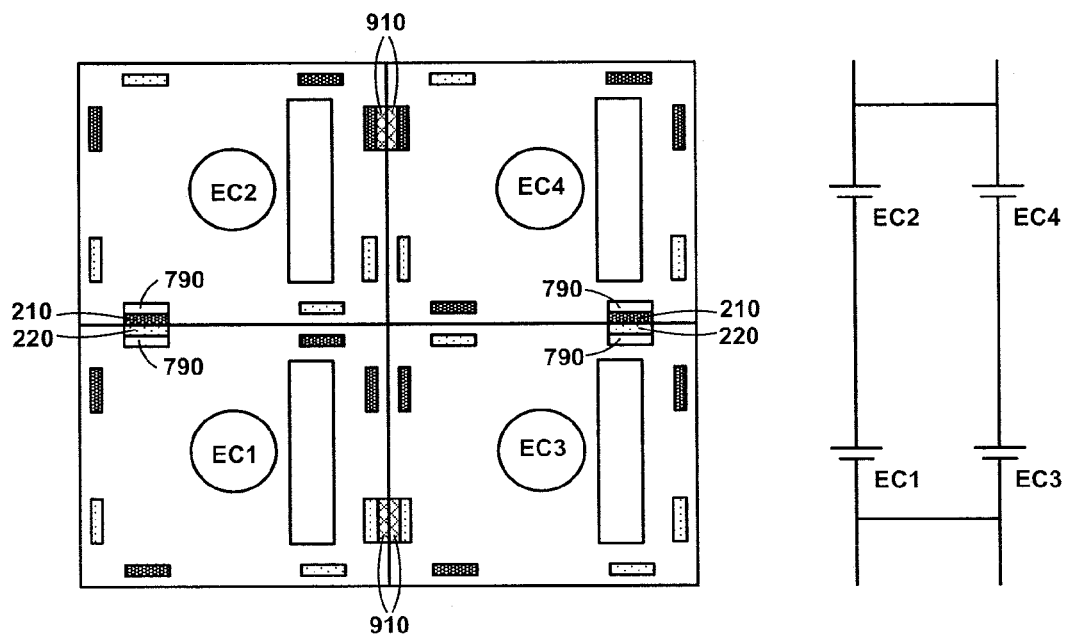
FIG. 12 is a top view of four holders mechanically and electrically coupled to form a multi-cell battery of four electrochemical cells in series and in parallel.

FIG. 12 is a top view of four holders 700 mechanically and electrically coupled to form a multi-cell battery of four electrochemical cells (EC1, EC2, EC3, and EC4) in series and in parallel. In this embodiment, the positive terminals 220 and the negative terminals 210 are configured for selective retraction such that the terminal is retracted within a terminal cavity 790 of the holder 700 so it will not electrically connect to a corresponding terminal of an adjacent holder. The terminals can also be extended such that they are coplanar with, or slightly protruding from, an exterior surface of the holder 700 so it will electrically connect with a corresponding terminal of an adjacent holder.

As a non-limiting example, the selective retraction of terminals in this embodiment may be configured as a catch and spring mechanism so that the terminal is biased to the extended position by a spring and held in the retracted position by a catch. As another non-limiting example, the selective retraction may include a screw mechanism that rotates one direction to extend the terminal and rotates another direction to retract the terminal. The screw mechanism may be more appropriate for some embodiments that may be exposed to harsh environments, such as, for example, vibration and shock.

As can be seen in FIG. 12, for electrochemical cell EC1, the positive terminal 220 is extended within its terminal cavity 790 to abut with the negative terminal 210 extended from its terminal cavity 790 for electrochemical cell EC2. Similarly, for electrochemical cell EC3, the positive terminal 220 is extended within its terminal cavity 790 to abut with the negative terminal 210 extended from its terminal cavity 790 for electrochemical cell EC4. Connection plugs 910 create the parallel electrical coupling between positive terminals 220 of electrochemical cell EC2 and electrochemical cell EC4. Also, connection plugs 910 create the parallel electrical coupling between negative terminals 210 of electrochemical cell EC1 and electrochemical cell EC3.

Although the present invention has been described with reference to particular embodiments, the present invention is not limited to these described embodiments. Rather, the present invention is limited only by the appended claims and their legal equivalents.

What is claimed is:

1. A multi-cell battery, comprising:
   two or more electrochemical cell circuits operably coupled to form the multi-cell battery, wherein each of the two or more electrochemical cell circuits comprises:
      a single electrochemical cell;
      a bypass switch operably coupled to switch a first holder terminal to either a second holder terminal or a cell terminal of the single electrochemical cell; and
      monitor and control circuitry operably coupled to the single electrochemical cell and the bypass switch and configured for:
         monitoring a voltage across the single electrochemical cell; and
         selectively operating the bypass switch to connect or disconnect the cell terminal from the second holder terminal responsive to the monitoring.

2. The multi-cell battery of claim 1, wherein each of the two or more electrochemical cell circuits further comprises a temperature sensor operably coupled to the monitor and control circuitry and configured for disposition in a holder for the single electrochemical cell and proximate the single electrochemical cell and wherein the monitor and control circuitry is further configured for:
   sampling the temperature sensor to determine temperature information; and
   selectively operating the bypass switch to connect or disconnect the cell terminal from the second holder terminal responsive to the temperature information.

3. The multi-cell battery of claim 1, wherein the two or more electrochemical cell circuits are operably coupled in series.

4. The multi-cell battery of claim 1, wherein the two or more electrochemical cell circuits are operably coupled in parallel.

5. The multi-cell battery of claim 1, wherein the two or more electrochemical cell circuits comprise four or more electrochemical cell circuits and at least two of the four or more electrochemical cell circuits are operably coupled in parallel and at least two of the four or more electrochemical cell circuits are operably coupled in series.

6. The multi-cell battery of claim 1, wherein the bypass switch in each of the two or more electrochemical cell circuits comprises a first transistor operably coupled between the cell terminal and the first holder terminal and a second transistor operably coupled between the first holder terminal and the second holder terminal, and each of the first transistor and the second transistor is controlled by a switch control signal from the monitor and control circuitry.

7. A multi-cell battery, comprising:
   a first electrochemical cell circuit, comprising:
      a first positive terminal;
      a first negative terminal;
      a first electrochemical cell including a first cell terminal;
      a first bypass switch; and
      first monitor and control circuitry operably configured to monitor a first voltage across the first electrochemical cell and to operate the first bypass switch responsive to the monitoring to couple the first positive terminal and the first negative terminal or couple the first cell terminal to one of the first positive terminal and the first negative terminal; and
   a second electrochemical cell circuit, comprising:
      a second positive terminal;
      a second negative terminal;
      a second electrochemical cell including a second cell terminal;
      a second bypass switch; and
      second monitor and control circuitry operably configured to monitor a second voltage across the first electrochemical cell and to operate the second bypass switch responsive to the monitoring to couple the second positive terminal and the second negative terminal or couple the second cell terminal to one of the second positive terminal and the second negative terminal;
   wherein the first positive terminal is operably coupled to the second positive terminal and the first negative terminal is operably coupled to the second negative terminal.

8. The multi-cell battery of claim 7, wherein:

the first electrochemical cell circuit further comprises a first temperature sensor disposed proximate the first electrochemical cell and operably coupled to the first monitor and control circuitry; and the second electrochemical cell circuit further comprises a second temperature sensor disposed proximate the second electrochemical cell and operably coupled to the second monitor and control circuitry.

9. The multi-cell battery of claim 7, wherein:

the first bypass switch comprises a first transistor operably coupled between the first cell terminal and the first positive terminal and a second transistor operably coupled between the first positive terminal and the first negative terminal; and the second bypass switch comprises a third transistor operably coupled between the second cell terminal and the second positive terminal and a fourth transistor operably coupled between the second positive terminal and the second negative terminal.

10. A multi-cell battery, comprising:

a first electrochemical cell circuit, comprising:
- a first positive terminal;
- a first negative terminal;
- a first electrochemical cell including a first cell terminal;
- a first bypass switch; and
- first monitor and control circuitry operably configured to monitor a first voltage across the first electrochemical cell and to operate the first bypass switch responsive to the monitoring to couple the first positive terminal and the first negative terminal or couple the first cell terminal to one of the first positive terminal and the first negative terminal; and a second electrochemical cell circuit, comprising:
- a second positive terminal;
- a second negative terminal;
- a second electrochemical cell including a second cell terminal;
- a second bypass switch; and
- second monitor and control circuitry operably configured to monitor a second voltage across the first electrochemical cell and to operate the second bypass switch responsive to the monitoring to couple the second positive terminal and the second negative terminal or couple the second cell terminal to one of the second positive terminal and the second negative terminal;

wherein the first positive terminal forms a positive battery terminal of the multi-cell battery, the second positive terminal is operably coupled to the first negative terminal, and the second negative terminal forms a negative battery terminal of the multi-cell battery.

11. The multi-cell battery of claim 10, wherein:

the first electrochemical cell circuit further comprises a first temperature sensor disposed proximate the first electrochemical cell and operably coupled to the first monitor and control circuitry; and the second electrochemical cell circuit further comprises a second temperature sensor disposed proximate the second electrochemical cell and operably coupled to the second monitor and control circuitry.

12. The multi-cell battery of claim 10, wherein:

the first bypass switch comprises a first transistor operably coupled between the first cell terminal and the first positive terminal and a second transistor operably coupled between the first positive terminal and the first negative terminal; and the second bypass switch comprises a third transistor operably coupled between the second cell terminal and the second positive terminal and a fourth transistor operably coupled between the second positive terminal and the second negative terminal.

\* \* \* \* \*